United States Patent [19]
Degani et al.

[11] Patent Number: 6,154,370
[45] Date of Patent: Nov. 28, 2000

[54] RECESSED FLIP-CHIP PACKAGE

[75] Inventors: Yinon Degani, Highland Park; Robert Charles Frye, Piscataway; Yee Leng Low, Berkeley Heights, all of N.J.

[73] Assignee: Lucent Technologies Inc., Murray Hill, N.J.

[21] Appl. No.: 09/120,148

[22] Filed: Jul. 21, 1998

[51] Int. Cl.[7] .................................................... H05K 1/18
[52] U.S. Cl. ........................ 361/761; 361/764; 361/748; 361/803; 257/723
[58] Field of Search ...................... 361/748, 761, 361/764, 794, 780, 803, 784, 790; 257/723

[56] References Cited

U.S. PATENT DOCUMENTS

| | | | |
|---|---|---|---|
| 5,608,262 | 3/1997 | Degani et al. | 257/723 |
| 5,715,144 | 2/1998 | Ameen et al. | 361/790 |
| 5,786,986 | 7/1998 | Bregman et al. | 361/719 |
| 5,869,894 | 2/1999 | Degani et al. | 257/723 |

*Primary Examiner*—Jayprakash N. Gandhi
*Attorney, Agent, or Firm*—Thomas, Kayden, Horstemeyer & Risley LLP

[57] ABSTRACT

The specification describes a recessed chip IC package in which the cavity in the printed wiring board into which the IC chip is recessed is used as a through hole interconnection, thus increasing the interconnection density. If the through cavity interconnections are used as power and ground the signal I/O pads and the signal runners are effectively isolated.

7 Claims, 2 Drawing Sheets

RECESSED FLIP-CHIP PACKAGE

FIELD OF THE INVENTION

This invention relates to multi-chip module (MCM) integrated circuit packages and more specifically to MCM packages in which one or more chips are recessed into cavities in an interconnection substrate.

BACKGROUND OF THE INVENTION

Recessed chip MCM packages are gaining acceptance in IC device interconnection technology because of efficient utilization of interconnect substrate area, low overall package profile, and reduced interconnection length. A variety of recessed chip package options are described and claimed in U.S. Pat. No. 5,608,262, issued Mar. 4, 1997 which, for purposes of this disclosure, is incorporated herein by reference.

Recessed chip packages are characterized by three components, a primary IC chip, defined for the purpose of this exposition as a first level component, an intermediate interconnection substrate (IIS) which may be either an IC chip or a passive interconnection substrate, defined here as a second level component, and a system interconnection substrate (SIS) which is typically a printed circuit board (PCB) and defined as a third level component. These components are progressively larger in area so that the second level component(s) can support one or more IC chips, and the third level components can accommodate one or more second level components. In a three component package, the first level components are typically flip-chip bonded to the second level components, and the second level components are flip-chip mounted on the third level component with the first level components recessed into cavities formed in the third level component.

A number of variations using this basic concept are possible, e.g. the system interconnection substrate can itself function as an intermediate interconnection substrate and attach to a fourth board level, with the second level components recessed into cavities in the fourth level component.

Recessed cavity structures have efficient interconnection arrangements, but there is an ever growing need for denser interconnections and higher interconnection performance.

STATEMENT OF THE INVENTION

We have developed a improved interconnection approach for recessed chip MCM packages. The essential feature of the improvement is the use of the cavity for interlevel interconnections by metallizing the sidewalls of the recessed cavity sidewalls, and using this metallization for one or more through connections. The through cavity interconnection approach allows multiple interlevel interconnections in a single cavity, and is particularly well suited for power and ground interconnections.

DETAILED DESCRIPTION

Figure 1:
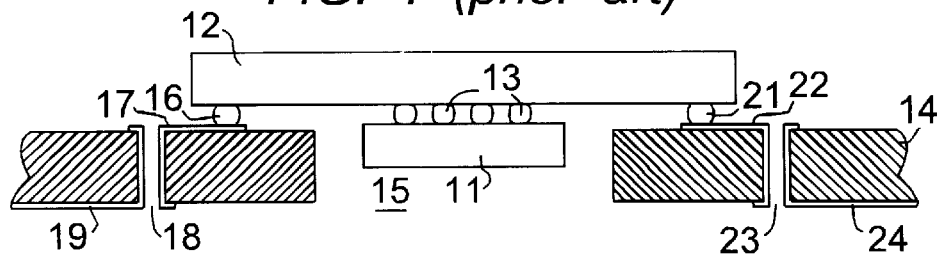
FIG. 1 is a schematic representation in partial cross section of a conventional interconnection system for recessed chip MCM packages.

Referring to FIG. 1, a recessed-chip module is shown comprising IC chip 11 and intermediate interconnection substrate (IIS) 12. The IIS can be any suitable material such as epoxy or ceramic, but is preferably silicon. The chip 11 is flip-chip bonded to IIS 12 by interconnections 13 which are typically solder, but may be other conductive material such as conductive epoxy. The technique used for the flip-chip bond is not part of the invention and may e.g. be solder bump or ball bonding, or conductive epoxy etc. The IIS tile 12 is in turn flip-bonded to printed wiring board (PWB) 14 with solder or conductive epoxy I/O interconnections 15. In a recessed chip MCM the PWB 14 is provided with a cavity 15 so that the chip 11 can be recessed below the PWB surface as shown. The cavity may extend through the thickness of the PWB as shown in FIG. 1, or may extend only partially through the PWB. In the arrangement shown the PWB is a single level board with dual side printed circuits. It could also be a multilevel PWB. The PWB may be interconnected to a system printed wiring board (not shown). A cutaway portion of the PWB is shown to illustrate that the PWB is a portion of a larger PWB that may accommodate several IISs.

The IIS 12 may be an active device, such as a quad package, with a large array of I/O bonding sites arranged in a square or rectangular configuration at the periphery of the substrate. Alternatively the IIS may be a passive interconnection substrate, such as silicon, with a printed circuit on one or both sides. In the interconnection arrangement shown in the FIG. 1, the solder ball 16 is bonded to a bonding pad on the PWB 14, and the pad is interconnected by runner 17 that extends to plated through hole interconnection 18, and then via runner 19 on the bottom of the PWB to another contact site (not shown). The other contact site may another bonding pad, if the PWB is to be soldered to another board, or if wire bonds are made to the PWB. Alternatively, e.g., the contact sites may be slot interconnections if the PWB is a plug-in circuit card. For the purpose of this description the interconnection shown by 16, 17, 18, and 19 is a power interconnection, and the similar interconnection comprising elements 21, 22, 23, and 24 is a ground interconnection. The remaining I/O connections are not shown but are conventional.

Figure 2:
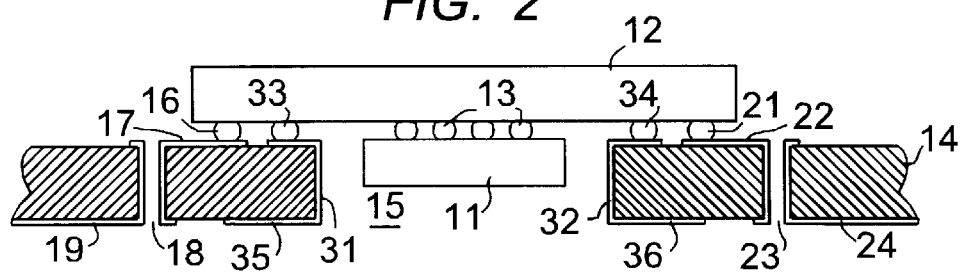
FIG. 2 is a view similar to that of FIG. 1 showing one embodiment of the improved interconnection arrangement of the invention.

Turning to the improved arrangement shown in FIG. 2, the interconnection in this embodiment comprises edge connectors 31 and 32 which extend from the top of the PWB to the bottom of the PWB along the edges or sidewalls of the cavity 15. Elements common to both figures have the same reference numbers. Solder bump interconnections 33 and 34 provide added interconnection capability to the structure. In the embodiment of FIG. 2, the solder bumps 33 and 34 interconnect the IIS 12 to contact pads on the top of the PWB 14, then along plated edge connectors 31 and 32 to runners 35 and 36 on the bottom of the PWB. The added interconnections that are made possible by using conductive plating on the edge of the cavity in a recessed chip board assembly can accommodate I/O signals but are preferably used for power and ground interconnections. This configuration allows the power and ground connections to be optimally short, and allows them to be relatively isolated from the signal runners.

Figure 4:
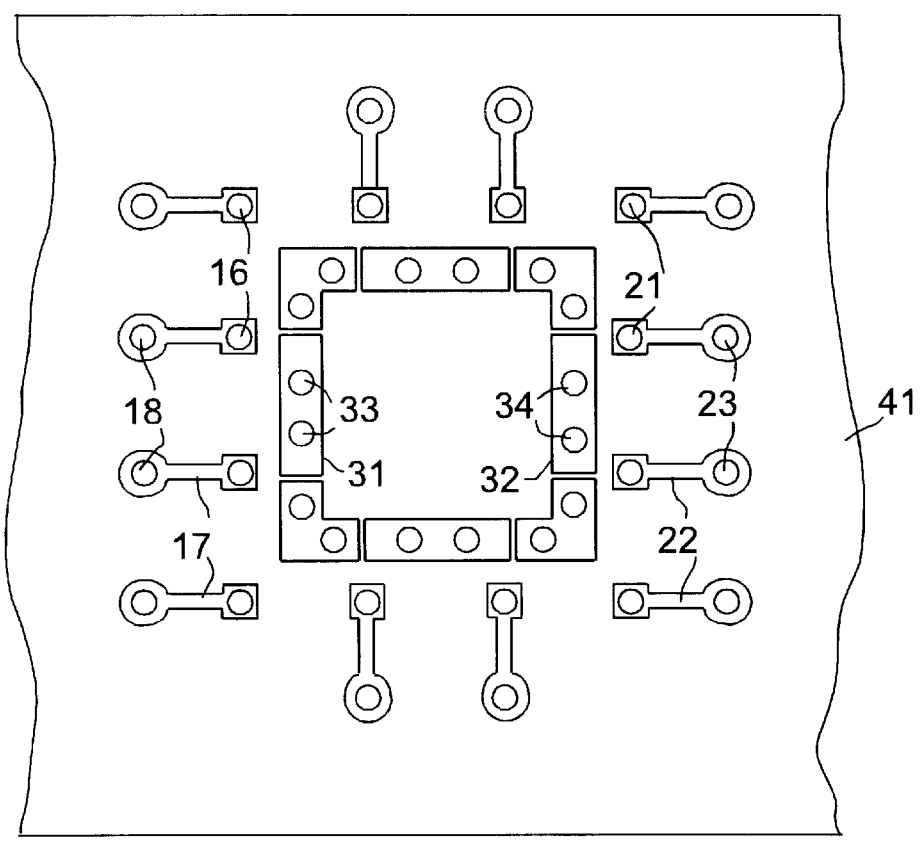
FIG. 4 is a plan view of the top side of the interconnection substrate of FIG. 3.
Figure 3:
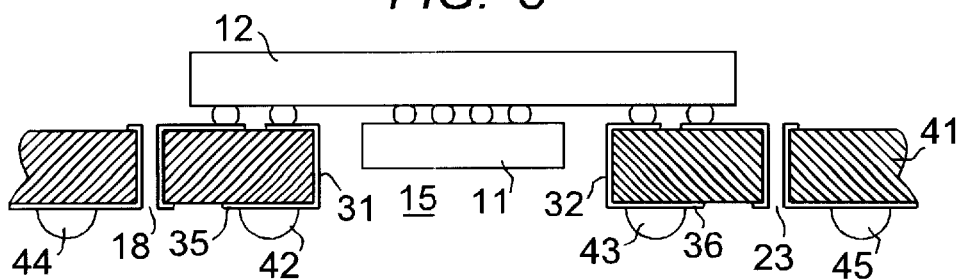
FIG. 3 is a view similar to that of FIG. 2 showing an alternative embodiment.
Figure 5:
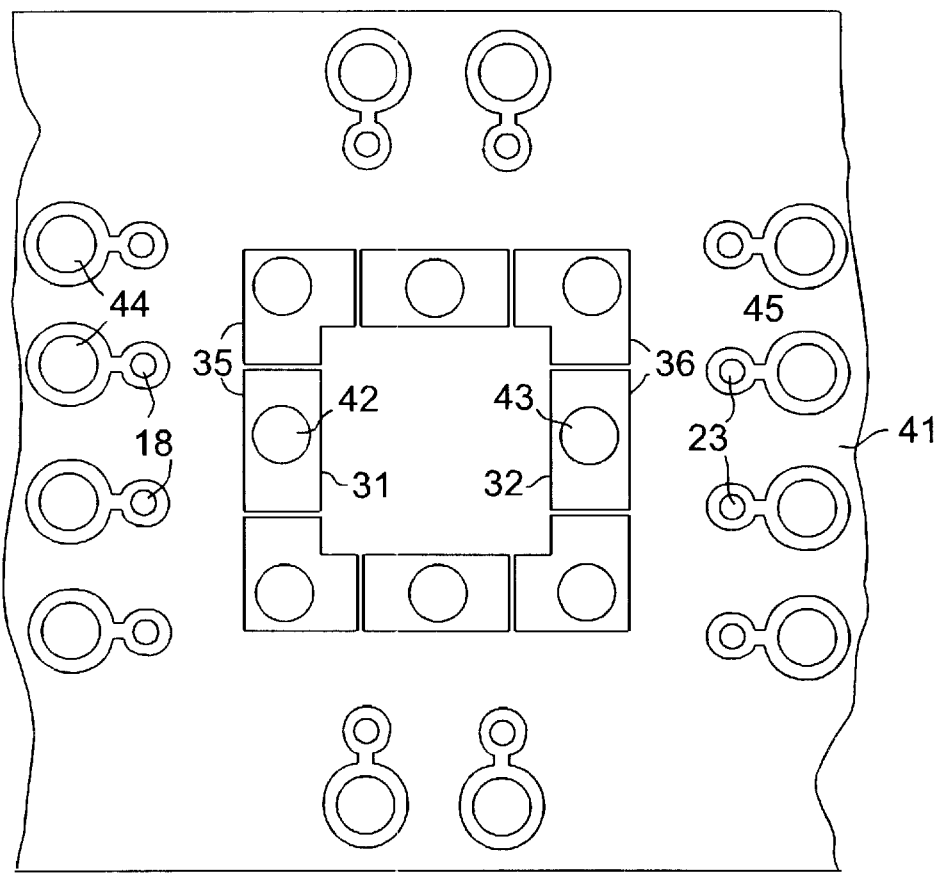
FIG. 5 is a plan view of the bottom side of the interconenction substrate of FIG. 3.

Another embodiment of the invention is shown in FIG. 3 where the IIS 12 is attached to a ball grid array interconnection substrate 41. Ball bonds 42 and 43 are power and ground interconnections and ball bonds 44 and 45 comprise the I/O signal interconnections. The top side of interconnection substrate 41 is shown in plan view in FIG. 4, with the IIS 12 removed, and the under side of the interconnection substrate is shown in FIG. 5. In the ball grid array embodiment of FIGS. 3–5 the interconnection substrate 41 is adapted to be mounted on a system board (not shown).

The advantages of the invention will be apparent to those skilled in the art. Plated through hole interconnections in MCM packages such as those described here require large capture pads which dictate the overall size of the package. Eliminating one or more plated through hole interconnections results in a saving of interconnection substrate area as well as improving the packaged device performance as mentioned earlier. FIG. 4 shows that with the elimination of the usual capture pads for the power and ground through hole interconnections, most of the interconnection substrate area (an enhanced area) is available for signal I/O interconnections. The routing arrangement shown in FIG. 4 is relatively simple, i.e. each runner leads directly from the signal bump to an adjacent through hole. In other circuit designs the routing may be more complex, i.e. from a signal bump to a remote through hole. The availability of extra routing space, made possible by the cavity edge interconnections for power and ground, is a significant advantage.

The invention is especially useful for multi-chip module packages in which one or more of the chips are RF chips. RF devices are particularly susceptible to interference from external electromagnetic fields. In the interconnection arrangements described here it is straightforward to further isolate the RF chip from external fields by capping the cavity with a grounded conductive cap.

It should be evident that the invention is applicable to PWB interconnection arrangements wherein the intermediate PWB has an opening that extends completely through the thickness of the board, and the MCM is mounted so as to recess significantly below the surface of the board, thus reducing the package profile. Typically such structures are quadrangular in shape, and frequently square in shape. The intermediate interconnection substrate, to which the IC chips are attached, covers the cavity so that the four edge portions extend over portions of the PWB, and ball or bump bonds are made between the intermediate interconnection substrate and the PWB. In the typical structure the IIS covers the entire cavity and all four edges overlap the PWB as viewed from above. However, structures may be equally effective in which only two facing edges of the IIS overlap the PWB and ball or bump bonds are made along those two facing edges. In principle, recessed chip packages can be made with interconnections along only one edge of the cavity.

Figure 6:
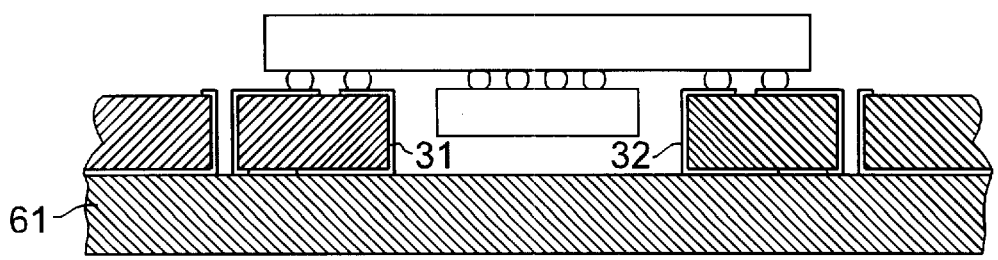
FIG. 6 is a view similar to that of FIG. 2 showing an alternative embodiment.

The invention is also applicable to multilayer PWBs in which the cavity extends only partially through the thickness of the PWB. Such an arrangement is shown in FIG. 6 where the added PWB level is shown at 61. The power and ground cavity edge interconnections 31 and 32 comprise part of the interlevel printed circuit as shown. The power and ground runners in the arrangement of FIG. 6 may be terminated at contact pads (not shown) on either the bottom or the top of the multilayer board. For purposes of defining the invention the term printed wiring board is intended to include a single level board, or one level of a multilevel board. When interconnection is made from the PWB surface to an interlevel printed circuit, reference to upper and lower surfaces of the PWB will to be understood to include the upper surface and an intermediate level.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. An IC package comprising:
   a. a printed wiring board (PWB) having an upper major surface and a lower major surface, and at least one quadrilateral cavity formed in said upper major surface and extending through said PWB to said lower major surface,
   b. a first array of interconnection sites on said upper major surface of said PWB along at least one edge of said cavity,
   c. an intermediate interconnection substrate (IIS) attached to said printed wiring board and substantially covering said cavity, said IIS having an upper major surface and a lower major surface,
   d. a second array of interconnection sites on the lower major surface of said IIS, with said second array of interconnection sites attached to said first array of interconnection sites on said PWB,
   e. at least one IC chip attached to said second major surface of said IIS with said at least one IC chip extending into said cavity,
   f. an interlevel interconnection between a first site on said upper major surface of said PWB and a second site on said lower surface of said PWB, said interconnection comprising a conductive runner extending from said first site along the upper surface of said PWB to the edge of said cavity, along the edge of said cavity, and from the edge of said cavity along the lower surface of said PWB to said second site.

2. The IC package of claim 1 wherein the PWB is a multilevel PWB and the said lower major surface corresponds to an interlevel surface.

3. The IC package of claim 1 in which said interlevel interconnection extends along one edge of said cavity and another interlevel interconnection extends along another edge of said cavity.

4. The IC package of claim 1 in which the said interlevel interconnection is a power or ground interconnection.

5. The IC package of claim 1 in which the IIS comprises silicon.

6. The IC package of claim 1 wherein the interconnections between said arrays of interconnection sites comprise solder.

7. The IC package of claim 1 further including a ball grid array on the lower surface of said PWB.

* * * * *